United States Patent [19]

Roun

[11] Patent Number: 4,952,752
[45] Date of Patent: Aug. 28, 1990

[54] CASING

[75] Inventor: Ben Roun, Yun-Her, China

[73] Assignee: Acer Incorporated, China

[21] Appl. No.: 296,487

[22] Filed: Jan. 12, 1989

[51] Int. Cl.⁵ .............................................. H05K 9/00
[52] U.S. Cl. ............................. 174/35 R; 174/35 GC
[58] Field of Search ....................... 174/35 R, 35 GC; 361/424; 220/80

[56] References Cited

U.S. PATENT DOCUMENTS

| | | | |
|---|---|---|---|
| 2,065,651 | 12/1936 | Burton | 174/35 GC |
| 2,629,764 | 2/1953 | Wiley | 174/35 GC |
| 4,300,016 | 11/1981 | Bergeron et al. | 174/35 R |

Primary Examiner—Leo P. Picard
Assistant Examiner—David A. Tone
Attorney, Agent, or Firm—Andrus, Sceales, Starke & Sawall

[57] ABSTRACT

An electromagnetic radiation barrier (30) for a casing, particularly for a personal computer, is formed by a connecting member having a generally U-shape with one arm (31) of the connecting member being fixed between an upturned edge section (12) of an upper casing member and another part of the upper casing member. The U-shaped member is made of a resilient metal so that upon insertion of an upper portion (21) of a lower casing member (20) into the cavity (33) defined between the arms of the connecting member, the lower casing member (20) is connected to the upper casing member and a substantially continuous electrical contact is achieved between the connecting member (30) and the lower casing member (20).

7 Claims, 2 Drawing Sheets

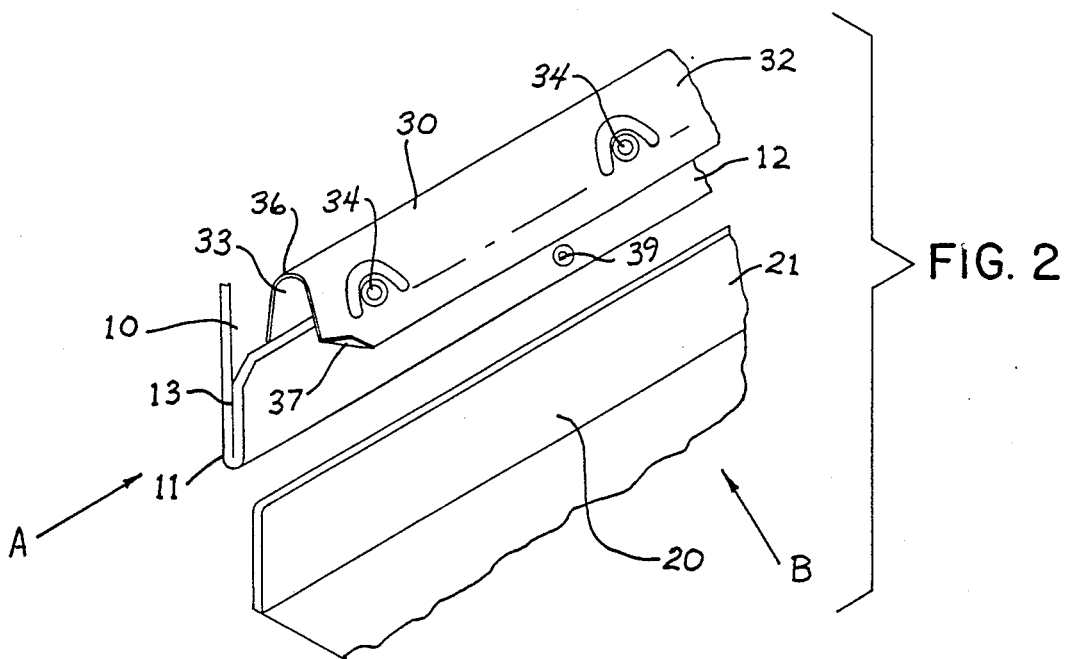
FIG. 2
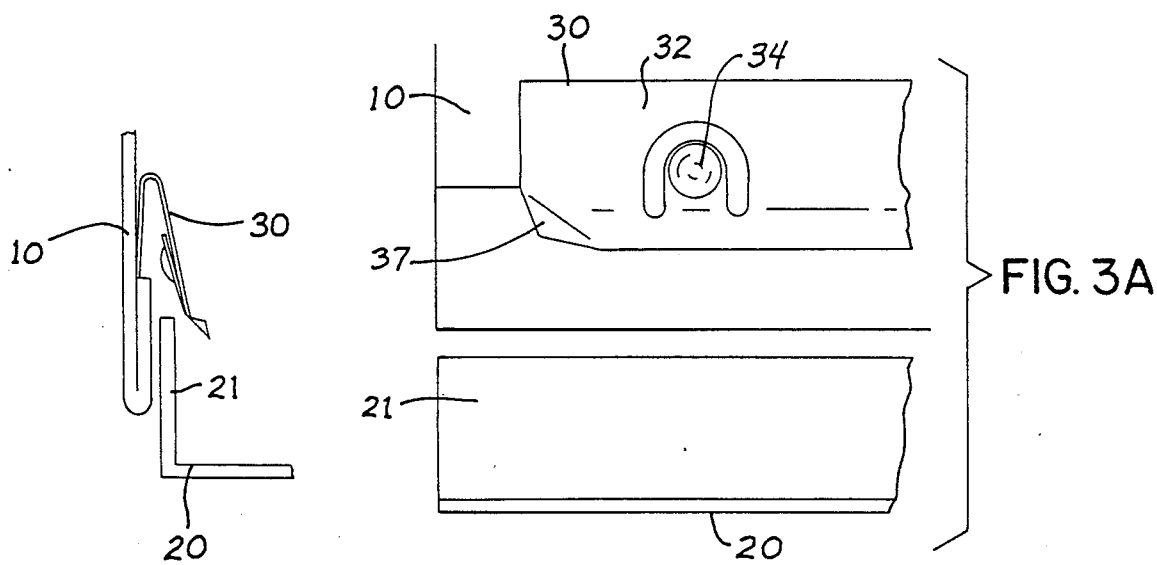
FIG. 3
FIG. 3A

CASING

The present invention relates to a casing, for example for a personal computer, the casing being of the kind having a pair of casing members respective walls of which can be removably connected; and a connecting member mounted to a first one of the walls and connectable to the second wall. Such a casing is hereinafter referred to as of the kind described.

The flow of electricity within electrical elements causes the generation of electromagnetic radiation (EMR) and this will interfere with other electrical products. In radio, the EMR will give rise to noise while it will interfere with pacemakers and could be fatal to the patient. Personal computers are widely used in our daily life and these also generate EMR. Even though such computers are housed in a casing, some EMR leakage occurs. Therefore, many means have been used to prevent the EMR leaking from the computer casing.

In fact, if the casing of an electrical product consitutes a closed loop, the EMR generated will not leak out. Typically a computer casing is constructed by an upper and lower casing member and there are two places where the EMR can leak out. One is on the rear side where many slots are configured for the connector of the add-on card and the other site is on the connection between the upper and lower casing members.

One current method is to provide an N-type or N-shaped iron plate as the connecting member. The N-type iron plate is welded on the lower portion of the upper casing member. As the upper casing member is lowered towards the lower casing member, the top portion of the lower casing member will insert into the area between the N-type plate and the wall of the upper casing member. In the normal situation, the N-type plate will become a linkage between the upper and lower casing members.

If the N-type plate is deformed by external forces, mostly by the heat stress caused by welding and inadequate installing of the upper casing member, it will lose its function of being a linkage between the upper and lower casing members.

Another problem with the N-type plate is due to the fact that the N-type plate is mounted to the upper casing member by welding. The heat stress caused by welding will not only cause the deformation of the N-type plate, but also destroy the covering of the upper casing member, such as Vinyl covering, Vinyl being widely used as a covering for computer casings.

In accordance with the present invention, a casing of the kind described is characterised in that the connecting member is generally U-shaped; in that an end of the first wall is folded to lie alongside another part of the first wall to define a cavity in which one of the arms of the connecting member is gripped; and in that the second wall is connected to the first wall when positioned in the receiving slot defined between the arms of the connecting member.

The invention is particularly suited to casings for computers, such as personal computers.

In one example of the present invention, the connecting member constitutes an EMR barrier which is configured to be installed on a lower portion of an upper casing member and having a resilient or flexible property providing a continuous contact with the lower casing member so as to construct a closed loop and reach the goal of preventing the EMR leakage in the connection portion between the upper and lower casing members.

An example of a casing according to the invention will now be described and compared with a conventional EMR barrier with reference to the accompanying drawings, in which:

FIG. 2 is a perspective view showing part of a casing with an EMR barrier attached to the lower portion of an upper casing member;

FIG. 3 is an end elevation from the direction A in FIG. 2;

FIG. 3A is a front elevation seen from the direction B in FIG. 2;

Figure 1:
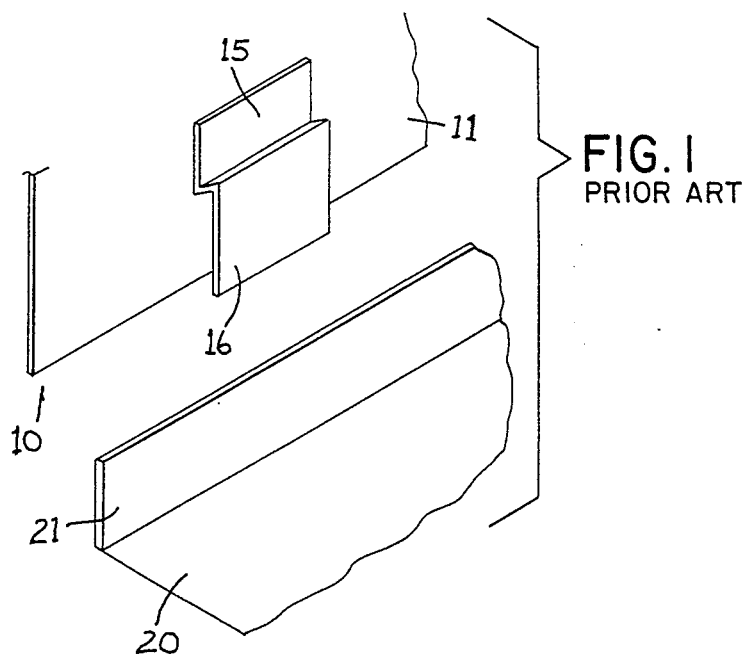
FIG. 1 is a perspective view showing the structure of the prior art.

FIG. 1 illustrates upper and lower casing members 10, 20 and an N-shaped connector plate 15 welded to a lower portion 11 of the upper member 10. Upon closure of the casing members 10, 20, the upper portion 21 of the lower member will be received in the gap between the leg 16 of the plate 15 and the upper casing member 10.

It is apparent from FIG. 1 that if the N-type plate 15 is deformed, for example by heat stress or external force, it will have a bad contact with the upper portion 21 of the lower casing member 20. On the other hand, since the iron plate 15 has little flexibility, it is not easy to control the clearance between the N-type plate 15 and the wall 11 of the upper casing member 10. If the clearance is too large, the contactability between the N-type plate 15 and the lower casing member will be poor. If the clearance is too narrow, it will be difficult to mount the upper casing member 10 on the lower member 20.

An example of a casing in accordance with the invention is illustrated in FIGS. 2-5. In this example, the lower portion 11 of the upper casing member 10 has an upturned end section 12 defining a cavity 13. A generally U-shaped connecting member 30 constituting an EMR barrier has a pair of arms 31, 32, the arm 31 being fixed in the cavity 13. It will be appreciated therefore that no welding of the connecting member 30 to the upper casing member 10 is required. Consequently, there will be no damage to the paint applied to the upper casing member.

Figure 4:
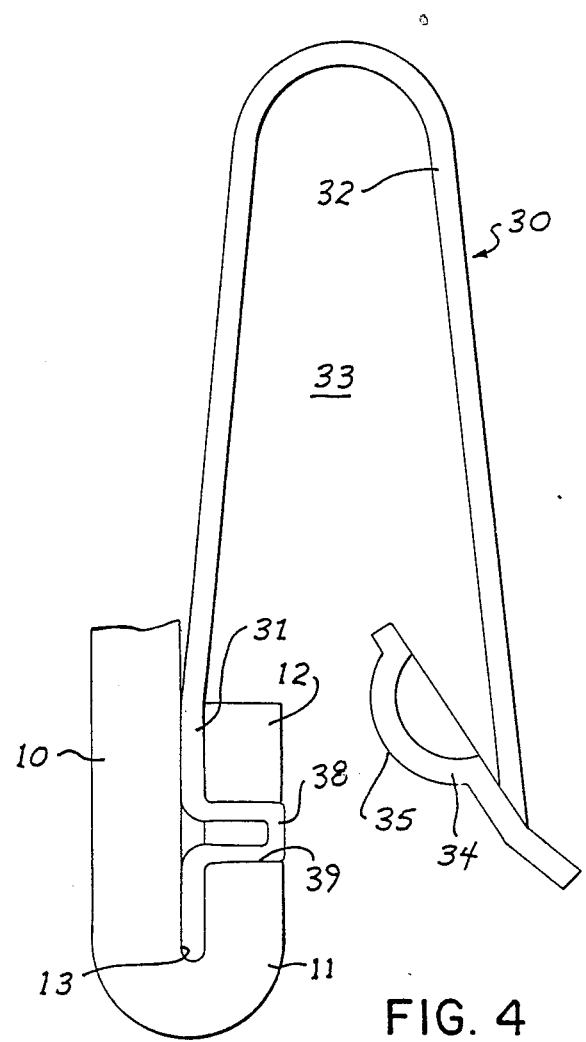
FIG. 4 is an enlarged view of the EMR barrier connecting member together with the upper casing member; and, FIG. 5 is a view similar to FIG. 3 but illustrating the casing members in their closed positions.

As can be seen most clearly in FIG. 4, the lower portion of the arm 31 of the connecting member 30 carries a number of projections 38 which are received in apertures 39 of the upturned section 12 of the lower portion 11 of the upper casing member 10. These projections 38 thus assist in anchoring the connecting member 30 to the upper casing member 10.

Figure 5:
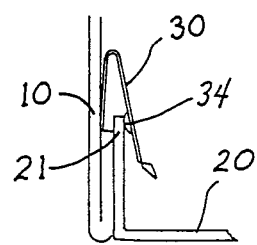

The connecting member 30 is made from a thin, flexible metal plate so it has a resilient form. The connecting member 30 is positioned such that when the upper casing member 10 is offered up to the lower casing member 20, the upper portion 21 of the lower casing member 20 is received between the arms 31, 32 of the connecting member. As will be explained in more detail below, as the upper section 21 of the lower casing member 20 is inserted into the connecting member 30, the arm 32 will be urged against its resilience, to the right as seen in FIGS. 3, 4, and 5, so as to achieve a steady contact between the connecting member 30 and the wall of the lower casing member.

As can be seen in FIGS. 2 and 3A, the connecting member 30 has an elongate form and the laterally outermost corners of the arm 32 are turned outwardly, as indicated at 37, to define guiding portions which assist in guiding the upper section 21 of the lower casing member 20 into the connecting member.

As can be seen most clearly in FIG. 4, the arm 32 of the connecting member 30 carries a number of contacting bosses 34 which project into the cavity 33 defined between the arms. The tips 35 of the contacting bosses 34 are biased into the cavity 33 so that upon insertion of the upper portion 21 of the lower casing member 20 into the cavity 33, the contacting bosses 34 will be pivoted against their bias and thereby ensure a good, steady contact with the lower casing member. This can be seen more clearly in FIG. 5 which illustrates the upper and lower casing members 10, 20 in their closed position and in which the upper portion 21 of the lower casing member 20 is clearly in contact with the contacting members 34. In this position, the connecting member 30 provides an EMR barrier by virtue of the continuous, electrical loop defined between the casing members via the connecting member so that electromagnetic radiation will not leak out of the casing.

Various modifications to the arrangement shown in the drawings can be envisaged. For example, the projections 38 could be provided on the section 12 of the upper casing member and be located in apertures in the lower end of the arm 31 of the connecting member.

I claim:

1. A casing having a pair of casing members, respective walls of which can be removably connected; and a connecting member mounted to a first one of the walls and connectable to the second wall characterised in that the connecting member is generally U-shaped; in that an end of the first wall is folded to lie alongside another part of the first wall to define a cavity in which one of the arms of the connecting member is gripped; and in that the second wall is connected to the first wall when positioned in the receiving slot defined between the arms of the connecting member.

2. A casing according to claim 1, wherein the connecting member forms an electromagnetic radiation barrier.

3. A casing according to claim 1, wherein a number of electrically conductive contact points are provided in the receiving slot so as to contact the second wall, the contact points being coupled with the first wall.

4. A casing according to claim 3, wherein the contact points are supported by the free arm of the connecting member.

5. A casing according to claim 1, wherein each lateral end of the free arm has a guide portion for assisting movement of the second wall into the connecting member.

6. A casing according to claim 1, wherein the one arm of the connecting member and the cavity have cooperating projections and recesses to anchor the connecting member in the cavity.

7. A casing according to claim 1 in which is mounted a computer.

* * * * *